United States Patent [19]

Beauducel et al.

[11] Patent Number: 4,810,913
[45] Date of Patent: Mar. 7, 1989

[54] INCREASED SENSITIVITY PIEZOELECTRIC HYDROPHONES

[75] Inventors: Claude Beauducel, Henonville; Thierry Gautier, Melun, both of France

[73] Assignee: Institut Francais du Petrole, Rueil-Malmaison, France

[21] Appl. No.: 86,947

[22] Filed: Aug. 19, 1987

[30] Foreign Application Priority Data

Aug. 27, 1986 [FR] France .................. 86 12205

[51] Int. Cl.$^4$ ............................. H01L 41/08
[52] U.S. Cl. ..................... 310/337; 310/324; 310/330; 310/331; 310/800; 367/160; 367/165; 367/173; 367/180
[58] Field of Search .............. 310/330–332, 310/800, 337, 338; 381/190; 367/164, 165, 170, 173, 180, 153, 155, 157, 160

[56] References Cited

U.S. PATENT DOCUMENTS

| Re. 32,180 | 6/1986 | Lewiner et al. | 310/800 X |
|---|---|---|---|
| 3,153,156 | 10/1964 | Watlington | 310/337 X |
| 3,970,878 | 7/1976 | Berglund | 310/337 |
| 4,056,742 | 11/1977 | Tibbetts | 310/800 X |
| 4,071,785 | 1/1978 | Yoshida et al. | 310/800 X |
| 4,156,800 | 5/1979 | Sear et al. | 310/800 X |
| 4,184,093 | 1/1980 | Sullivan | 310/800 X |
| 4,234,813 | 11/1980 | Iguchi et al. | 310/800 |
| 4,440,983 | 4/1984 | Facoetti et al. | 310/324 X |
| 4,486,869 | 12/1984 | Carter | 310/800 X |
| 4,536,862 | 8/1985 | Sullivan | 310/337 X |
| 4,704,556 | 11/1987 | Kay | 310/800 X |

FOREIGN PATENT DOCUMENTS

| 3212618 | 10/1983 | Fed. Rep. of Germany. |
|---|---|---|
| 3248222 | 6/1984 | Fed. Rep. of Germany. |
| 8102223 | 6/1981 | PCT Int'l Appl.. |

*Primary Examiner*—Mark O. Budd
*Attorney, Agent, or Firm*—Antonelli, Terry & Wands

[57] ABSTRACT

A hydrophone is provided having at least one flexible piezoelectric sensitive element applied to a support, each sensitive element being formed of a flexible piezoelectric film associated with two electrodes and is applied to a synthetic plastic material support one face at least of which has hollow parts of very different shapes, for example an homogeneous distribution of cups, honeycombs, holes, etc, whose dimensions are determined as a function of the mechanical characteristics of the films used. The stresses applied thereto result in deforming each film inwardly of the hollow parts, which very greatly increases the sensitivity.

10 Claims, 1 Drawing Sheet

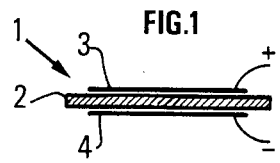
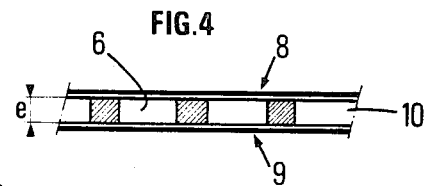
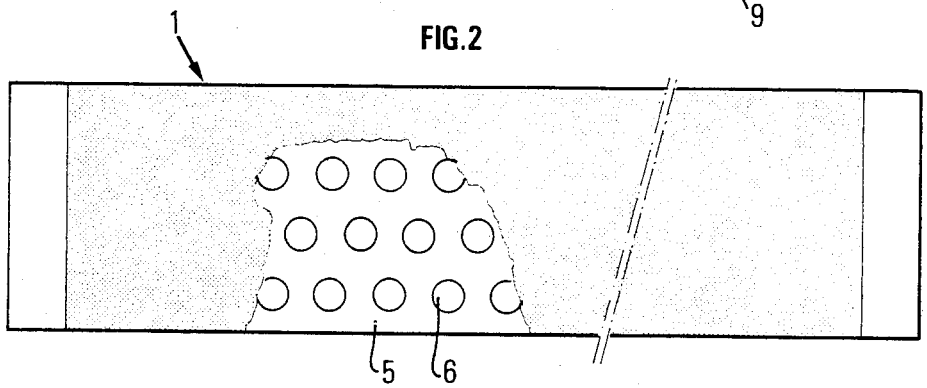
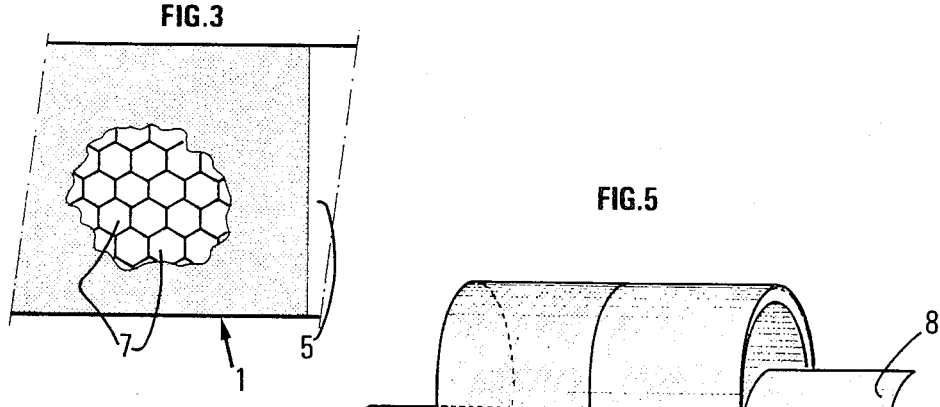
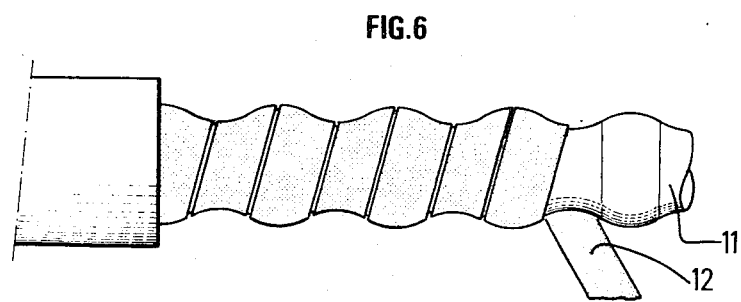

INCREASED SENSITIVITY PIEZOELECTRIC HYDROPHONES

BACKGROUND OF THE INVENTION

1. Field of the Invention

The invention relates to piezoelectric hydrophones with increased sensitivity.

Piezoelectric hydrophones generally include one or more sensitive elements each formed of a substrate with piezoelectric properties and two electrodes disposed on each side.

2. Description of the Prior Art

The substrate may be in the form of ceramic disks of relatively small dimensions, included in a rigid case having one or more faces transparent to the acoustic waves. U.S. Pat. No. 3,763,464 shows the construction of a piezoelectric hydrophone in which one, and preferably two ceramic disks, each provided with its electrodes, are fixed to two flexible plates facing each other. One at least on the plates is provided with a thicker rigid peripheral part bearing against the other.

The substrate may also be in the form of ribbons or flexible plates made from synthetic plastic material on which treatment confers piezoelectric properties. Materials are generally used such as PVDF (polyvinylidene fluoride), polyethylene, PTFE (polytetrafluoride ethylene) etc.

The flexible sensitive elements are very often used in the form of ribbons or strips disposed on a flat support or else would in a spiral about a cylindrical core. They are generally combined in pairs. By disposing them on each side of a support with opposite polarities and, by connecting them electrically, the parasitic voltages caused by bending of the support and acceleration are compensated for.

Using flexible strips, continuous hydrophones may be formed of relatively great length which provide wave number filtering. Incorporated in seismic streamers towed by a ship, they filter out certain particular parasitic noises and facilitate reception of the signals reflected by discontinuities of the submerged subsoil, in response to seismic waves emitted by a towed source.

Sensitive elements of this type are described in the French patent No. 2 145 099 to which correspond the U.S. Pat. No. 2,798,474, and the French patent application EN. 86/09.880.

The sensitive elements are very often formed from ribbons of small thickness, of the order of a few tens of $\mu$m, whose sensitivity is relatively low, generally less than 1V/bar (1 bar=$10^5$ Pa). For increasing the sensitivity of the sensors formed from such sensitive elements, several of them must be combined electrically, which increase the cost price and complicates the manufacture.

SUMMARY OF THE INVENTION

The invention relates to a hydrophone having increased sensitivity and formed from sensitive elements each including a film of synthetic plastic material associated on each of its faces with a uniform conducting film forming an electrode.

It further includes a locally rigid suppport made from a dielectric material one surface at least of which is provided with a distribution of well localized cavities, the sensitive element being disposed against this surface.

Preferably, the dimensions of the hollow parts are chosen so as to limit the deformations undergone by the sensitive element inwardly thereof under the effect of the stresses which are applied thereto, to values compatible with the characteristics of the film used.

The cavity distribution may be obtained by using a honeycomb structure, by removing material, by stamping etc.

The use of an unequal surface support means that at the level of the hollow parts the film is subjected to either flexions or stretching. These are operating modes in which the sensitivity of the sensitive elements is must higher than the normal case where they undergo flat compressions perpendicularly to their faces.

By a judicious choice of the dimensions of the hollow parts, irreversible deformation of the sensitive elements may be avoided and so constructed sensors are adapted for withstanding severe conditions of use.

BRIEF DESCRIPTION OF THE DRAWINGS

Other features and advantages of the hydrophone according to the invention will be clear from reading the description of several embodiments given by way of non limitative examples, with reference to the accompanying drawings in which:

FIG. 1 shows a sensitive element seen in section;

FIG. 2 shows a sensitive element applied to a support whose surface is provided with an irregular distribution of cavities;

FIG. 3 shows a variant of FIG. 1 in which the surface of the support is honeycombed;

FIG. 4 shows, seen in thickness, a support whose opposite faces are also provided with cavities and against which two sensitive elements are applied;

FIG. 5 shows one embodiment of a cylindrical shaped sensor obtained by winding a sensitive assembly such as that shown in FIG. 2; and FIG. 6 shows one embodiment in which the support for the sensitive element is arranged in ringlets.

DESCRIPTION OF THE PREFERRED EMBODIMENTS

The sensitive element 1 shown in FIG. 1 includes a thin film 2 made from a material such as PVDF for example to which treatment has conferred pizoelectric properties. This type of film is often available in the form of a ribbon of one or moe centimeters in width. On each side of the film are disposed two electrodes 3, 4 for collecting the electric charges created by deformation of film 2 in response to the applied stresses.

The sensitive element 1 is applied (FIG. 2) against a locally rigid support 5 provided with hollow parts 6 distribution regularly over at least one of the surfaces. This support is made for example from a synthetic material of PTFE type. Its local rigidity is sufficient for it to withstand, without appreciable deformation, the stresses applied to the sensitive element perpendicular to its faces, but it is sufficiently flexible to be wound.

It can be observed that the sensitivity of a sensitive element applied to a support whose surface is unequal is much greater than that which it may have when the surface of the support is smooth. Measurements show that the sensivity may be readily multiplied by a factor of four or five and even more. Increasing the sensitivity is due to the fact that the piezoelectric film works under flexion opposite each of the hollow parts of the support. For increasing the sensitivity of the sensor, supports are preferably used in which the total surface of the hollow parts is the greatest possible. This is achieved by increasing either the unitary surface of the hollow parts or their density per unity of surface. In a particular embodiment (FIG. 3), a support 5 is used whose surfaces included pockets 7 (honeycomb structure) which allows both a great hollow part density and a sufficient rigidity at the periphery thereof to be obtained.

The desired optimization of the sensitivity of the sensitive elements must however remain compatible with their mechanical strength.

It can be shown that the modulus of flexion d of a film is expressed by the relationship:

$$D = \frac{E \cdot h^3}{12/(1 - \alpha^2)} \quad (1)$$

where E and $\alpha$ represent respectively Young's modulus and Poisson's coefficient and h represents the thickness of the film.

Considering the relationship (1), the arrow f, that is to say the penetration of the film inside a circular hole of radius a, is expressed by the relationship:

$$F = \frac{K a^2}{D} \quad (2)$$

where K is a coefficient of proportionality.

The radial and tangential stresses undergone by a film when it flexes in a hollow, depend on its thickness, on the diameter of the hollows and on the pressure exerted and vary from the center to the periphery.

It can for example be shown that the radial stress CR and the tangential stress CT undergone by a film fixed to the periphery of a hollow of radius a, at a distance r from the center thereof, are expressed by the relationships:

$$CR = \frac{(k_1 a^2 - k_2 r)}{h} \cdot P \quad (3)$$

$$CT = \left( \frac{k_1}{h} \cdot a^2 - \frac{k_3}{h^2} \right) \cdot P$$

where $K_1$, $k_2$, $k_3$, are coefficients of proportionality and P represents the pressure applied.

Taking into account the mechanical characteristics of the film the maximum stresses may then be known which cause its rupture and so the maximum stresses compatible with safety can be determined. Thus, the maximum dimensions can be determined which should be given to the hollow parts as well as the operating range of the sensor formed with the sensitive element. For a hydrophone, a maximum immersion depth and/or a variation dynamic of the measured pressure are determined.

The depth of the cavities is preferably chosen so that the sensitive element operates short of its safety limits. When they are exceeded, the sensitive film comes to bear against the bottom of the hollow parts and withstands the excessive stresses without damage A flat support one of the faces of which has unevenesses of relief may be produced by any known method: molding, perforation or stamping, weaving or braiding, photo etching, or by using a substance naturally having surface unevenesses with homogeneous distribution etc. In the embodiment shown in FIG. 4, a hydrophone may be formed by disposing two sensitive elements 8, 9 on each side of a flat support 10 whose opposite faces have unevenesses of relief. The hollow parts 6, on each side of the support, may be separated from each other. But if the thickness 3 of the support is less than or equal to twice the maximum flexion which a sensitive film may undergo when bending, a flat ribbon may be used for this purpose with through holes or perforations. Under the effect of the stresses the two sensitive elements 8, 9 become hollow towards each other. If the deformations become excesive, the two sensitive elements then come into abutment one against the other.

In an arrangement already known from the above cited French patent 2.145.099 the two sensitive elements are disposed on each side of the support with opposite polarities. Thus, the electric charges created by flexion of the support are cancelled out.

A sensitive element may be applied to a support by bonding using a conducting adhesive. There are two ways of proceeding. The first consists in bonding the sensitive element solely to the periphery so that it is free at the periphery of each of the hollow parts. The second consists in bonding the sensitive element over the whole of its surface, so that the sensitive element is held at the periphery of all the cavities. Bonding the sensitive element solely to the periphery is simpler to achieve but increases the stresses applied to the film at the level of each hollow part. The stresses are lower in the case of bonding over the whole surface, which results in extending the safety limits. In addition, the conducting adhesive maintains the electric continuity better and thus makes the sensor less sensitive to mechanical damage which may occur because of the deformations.

In the embodiment shown in FIG. 5, the flat support may be given a cylindrical configuration. The perforated support 10, associated with its two sensitive elements 8, 9, is helically wound on itself, with jointing turns which are welded edge to edge. This arrangement gives particularly good results for compensating for the flexions and accelerations.

In the embodiment shown in FIG. 6, the support is formed of a tube arranged in ringlets or grooves 11 which is mainly deformable along it axis. At least one sensitive element 12 is wound in a spiral with jointing or non jointing turns. In an arrangement described in the above cited French patent application EN 86/09880, two sensitive elements would in helices in opposite directions may also be superimposed on the ringed support 11 so as to obtain better compensation for the flexions. The sensor thus formed is very sensitive to the stresses which may be exerted in the direction of its main deformation. The helical winding promotes the stretching of the sensitive films in all directions and this increases the sensitivity of the sensor. This arrangement is particularly suitable for constructing stress gauges.

Without departing from the spirit of the invention, other types of supports may be adopted having different shapes such as a cylindrical support whose surface has relief unevenesses for example.

What is claimed is:

1. A piezoelectric hydrophone including at least one sensitive element formed of a film made from a synthetic plastic material associated on each of its faces with a uniform conducting film forming an electrode, which hydrophone further includes a locally rigid support made from a dielectric material being would in a spiral with jointing turns, one surface at least of which is provided with a distribution of well localized cavities, the sensitive element being disposed against said surface.

2. The hydrophone as claimed in claim 1, wherein the dimensions of said localized cavities are effective to limit the deformations experienced by the sensitive element towards the inside of said cavities when stresses are applied thereto the values compatible with the characteristics of the film used.

3. The hydrophone as claimed in one of claims 1 or 2, wherein said surface of the support is provided with a regular distribution of hollow parts.

4. The hydrophone as claimed in claim 3, wherein said surface of the support is alveolate.

5. The hydrophone as claimed in claim 3, wherein said surface of the support includes a regular distribution of cavities formed by removal of material.

6. The hydrophone as claimed in claim 5, wherein the support includes a regular distribution of cavities formed by stamping.

7. The hydrophone as claimed in claim 4, wherein said support includes a honeycomb structure.

8. The hydrophone as claimed in claim 1, wherein the depth of said cavities is chosen so as to limit the deformation applied to each sensitive element by each of them.

9. The hydrophone as claimed in claim 1 further including two sensitive elements disposed respectively in contact with the faces of the same support, said support being perforated and its thickness being chosen so that the sensitive elements come to bear against each other when the stresses exerted exceed a give threshold.

10. A piezoelectric hydrophone for use throughout a large range of depths including a locally rigid plate provided with two opposite plane faces and at least two sensitive elements formed of a thin film made from a synthetic plastic material associated on each of its faces with a conducting film forming an electrode, said two sensitive elements being disposed against opposite faces of said locally rigid plate, wherein each plane face is provided with a honeycomb structure having a regular distribution of cavities whose dimensions are chosen so as to limit deformations experienced by the sensitive elements towards the inside of said cavities when stresses are applied thereto to values compatible with the characteristics of the film used to prevent irreversible damage.

* * * * *